United States Patent [19]

Dunn

[11] Patent Number: 4,998,160
[45] Date of Patent: Mar. 5, 1991

[54] SUBSTRATE POWER SUPPLY CONTACT FOR POWER INTEGRATED CIRCUITS

[75] Inventor: William C. Dunn, Mesa, Ariz.

[73] Assignee: Motorola, Inc., Schaumburg, Ill.

[21] Appl. No.: 449,155

[22] Filed: Dec. 15, 1989

Related U.S. Application Data

[63] Continuation of Ser. No. 300,400, Jan. 23, 1989, abandoned.

[51] Int. Cl.⁵ .................. H01L 27/12; H01L 27/02
[52] U.S. Cl. ............................ 357/81; 357/65; 357/47
[58] Field of Search ............... 357/47, 48, 50, 81

[56] References Cited

U.S. PATENT DOCUMENTS

| | | | |
|---|---|---|---|
| 3,940,785 | 2/1976 | Genesi | 357/48 |
| 3,986,196 | 10/1976 | Decker et al. | 357/68 |
| 4,092,614 | 5/1978 | Sakuma et al. | 357/81 |
| 4,286,280 | 8/1981 | Sugawara | 357/50 |
| 4,494,134 | 1/1985 | Wildi et al. | 357/48 |
| 4,531,145 | 7/1985 | Wiech, Jr. | 357/81 |
| 4,639,761 | 1/1987 | Singer et al. | 357/23.4 |
| 4,646,126 | 2/1987 | Iizuka | 357/80 |
| 4,684,973 | 8/1987 | Takano et al. | 357/48 |
| 4,709,159 | 11/1987 | Pace | 357/81 |
| 4,720,739 | 1/1988 | Beasom | 357/49 |
| 4,779,123 | 10/1988 | Bencuya et al. | 357/65 |
| 4,785,344 | 11/1988 | Fraz | 357/65 |
| 4,786,952 | 11/1988 | MacIver et al. | 357/45 |
| 4,803,541 | 2/1989 | Konda | 357/68 |
| 4,829,360 | 5/1989 | Conzelmann et al. | 357/15 |
| 4,890,149 | 12/1989 | Bertotti et al. | 357/48 |
| 4,905,067 | 2/1990 | Morelli et al. | 357/48 |

FOREIGN PATENT DOCUMENTS

| | | | |
|---|---|---|---|
| 0140257 | 11/1980 | Japan | 357/81 |
| 0137662 | 10/1981 | Japan . | |
| 60-239035 | 11/1985 | Japan | 357/65 |
| 62-85455 | 4/1987 | Japan | 357/65 |

Primary Examiner—Andrew J. James
Assistant Examiner—Viet Q. Nguyen
Attorney, Agent, or Firm—Joe E. Barbee; Stuart T. Langley

[57] ABSTRACT

An integrated circuit having both logic transistors and at least one power switching transistor formed on the same substrate is described, wherein both sets of transistors are powered by current received from the substrate, the power transistor being powered by current flowing directly from the substrate, and the logic transistors being powered by current flowing through a metal layer making electrical contact to the substrate.

11 Claims, 1 Drawing Sheet

SUBSTRATE POWER SUPPLY CONTACT FOR POWER INTEGRATED CIRCUITS

This application is a continuation of prior application Ser. No. 07/300,400, filed Jan. 23, 1989 now abandoned.

BACKGROUND OF THE INVENTION

This invention relates in general to semiconductor integrated circuits, and more particularly to power integrated circuits which are serially connected between a power source and a load, having both logic and power switching transistors on the same chip.

A common application for power switching devices is as series switching elements connected between a power supply and a load. It is now possible to integrate logic circuitry on the same chip as the power switching device in such an application. In this application, the power supply voltage for the logic devices is the same as the substrate voltage of the power device. Logic circuitry is usually formed in a section of the chip which is electrically isolated from the power transistor, thus preventing the power supply voltage from contacting the logic devices.

In the past, integrated circuits with both logic and power switching transistors (power integrated circuits) provided the power supply voltage for the logic transistors by bonding a wire from a supply lead, which extends from the package, to a supply bond pad on the chip surface. The wirebond area available on the power supply lead is usually small because the lead must attach to the die mount portion of the package. The small area results in a more difficult and less reliable wirebond. The supply bond pad, required a significant amount of chip surface area which increased the size and cost of the chip. Several metal interconnections were formed on the chip surface to connect the supply pad to the various devices in the logic section powered by the supply voltage. The metal interconnections complicated the design of other interconnections made on the chip surface. A minimum number of metal interconnections on the chip surface is desirable.

Accordingly, it is an object of the present invention to provide an improved semiconductor integrated circuit with both power switching transistors and logic transistors on the same chip which does not require a power supply bond pad or power supply bond wire.

It is a further object of the present invention to provide a power integrated circuit which is less expensive to manufacture than current methods.

It is a further object of the present invention to provide a power integrated circuit with improved reliability.

It is a further object of the present invention to provide a power integrated circuit which requires a minimum number of metal interconnections on the chip surface to conduct power supply current to the logic section of the integrated circuit.

SUMMARY OF THE INVENTION

These and other objects and advantages are achieved in accordance with the present invention wherein there is provided a substrate power supply contact which also serves to provide power to the logic transistors of a power integrated circuit by tapping current flowing in the substrate of the device.

DETAILED DESCRIPTION OF THE FIGURES

Figure 1:
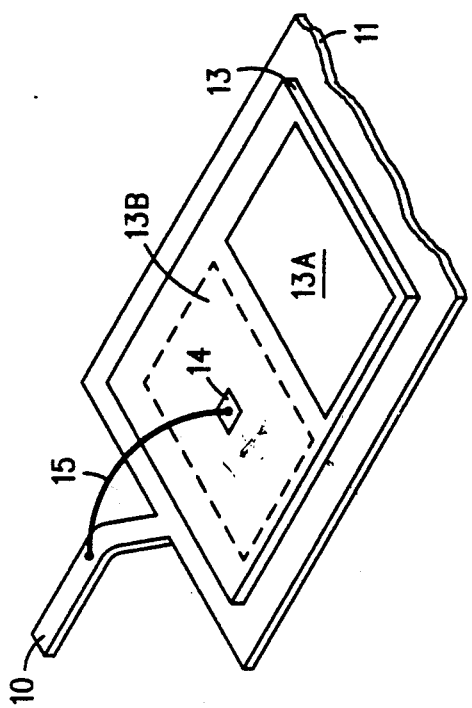
FIG. 1 illustrates an isometric view of a prior art power integrated circuit mounted on a portion of a package leadframe.

FIG. 1 illustrates a power integrated circuit chip mounted to a portion of the package which includes a power supply lead 10. The package type shown is illustrated as an example and not as a limitation. The present invention can be embodied in any semiconductor package wherein the supply lead electrically contacts the mounting surface for the semiconductor chip. Also, the complete package may have from three to seven or more leads extending from the package, while only power supply lead 10 is illustrated in FIG. 1. Power supply lead 10 extends from the package at one end, and attaches to die mount portion 11 at the other end. Power integrated circuit chip 13 is attached to die mount package portion 11 by a suitable electrically conductive solder, epoxy, or the like. Power integrated circuit 13 includes, among other things, power transistor section 13a and logic section 13b. It is noted that chip 13 may comprise many power transistor sections and many logic sections on the same chip. In a preferred embodiment, power transistor section 13a is a vertical field effect transistor. It is common practice for the drain electrode to be formed on the back surface of chip 13 and to connect the drain with the power supply via the package mounting portion 11. Portion 11 is some times referred to as a heatsink. Traditionally, power supply voltage is provided to logic section 13b of power integrated circuit 13 by forming wire bond 15 from power supply lead 10 to bond pad 14 located on logic section 13b. The present invention eliminates the need for both wire bond 15 and bond pad 14, as described below.

Figure 2:
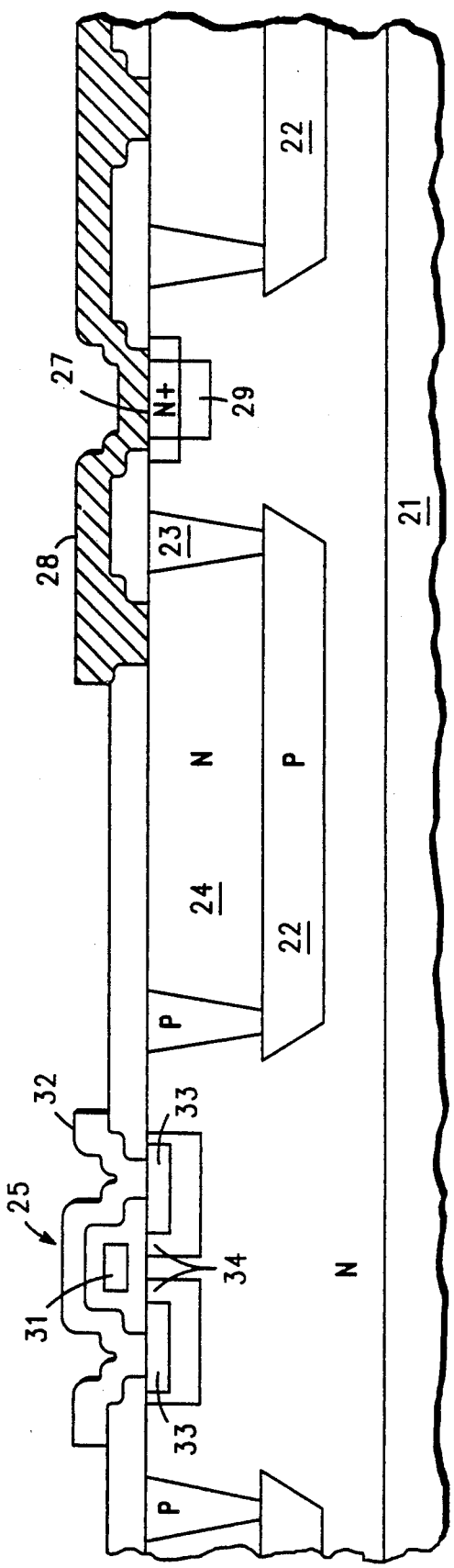
FIG. 2 illustrates a cross-sectional view of a portion of a power integrated circuit embodying the present invention.

FIG. 2 illustrates in cross-sectional form a portion of a power integrated circuit prepared in accordance with the present invention. The dopant types are illustrated as an example and not as a limitation. Also, isolation regions 22 and 23, which surround the isolated logic transistor areas of the chip, are illustrated as junction isolation, but one skilled in the art could use one of many isolation techniques such as dielectric isolation to electrically separate the power transistor sections from the logic transistor sections of the device. Semiconductor substrate 21 serves as the drain of power device 25. At least one buried isolation region 22 is selectively formed on the surface of substrate 21. An epitaxial layer is formed which completely covers substrate 21 including buried isolation region 22. A plurality of transistors and other devices (not shown) are formed in isolated logic transistor area 24.

Power transistor 25 lies outside of the lateral boundaries of buried isolation region 22. Power transistor 25 is illustrated as a power field effect transistor comprising source electrode 32, gate 31, source 33 and channel 34. Substrate 21 serves as the drain of power transistor 25. Current in power transistor 25 flows directly from substrate 21, through channel 34, to source 33 when gate 31 is energized.

Isolation regions 23 are formed on the surface through the epitaxial layer to buried isolation region 22.

Isolation regions 22 and 23 together delimitate isolated logic transistor area 24. Substrate contact 27 lies in a region between isolated areas, or at the edge of the chip, or near the power device, or any other location where it is outside the lateral boundaries of the buried isolation region 22. Many of these regions where substrate contact 27 can be located exist on the surface of power chip 13 and any number of contacts 27 can be made. Preferably, substrate contacts 27 are ohmic contacts. Metal layer 28 is deposited and patterned to electrically connect substrate contact 27 with the logic transistors in isolated logic transistor area 24. A heavily doped plug 29 may be used under contact 27 to lower resistance to current flow in the contact. Power supply voltage is thus provided to the logic section of the power integrated circuit through power supply lead 10 to the heatsink or die mount package portion 11 to substrate 21 of the power integrated circuit. Then substrate contact 27 and metal layer 28 provide a current path from substrate 21 to the logic section of the power integrated circuit. Thus power supply current is provided to isolated logic transistor area 24 without the use of wire bond 15 or wire bond pad 14 on the surface of the logic transistor section.

I claim:

1. An integrated circuit having both logic devices and at least one power switching transistor comprising: a semiconductor substrate of a first conductivity type; isolation regions completely surrounding the logic devices for electrically isolating the logic devices from the power switching transistor wherein the isolation regions are surrounded by a non-isolated area of the substrate; a selectively patterned conductive layer making ohmic contact to at least one area of the logic devices corresponding to a supply contact and making ohmic contact to the non-isolated area of the semiconductor substrate to provide electrical power from the semiconductor substrate to the logic devices when electrical power is supplied to the non-isolated area of the substrate.

2. The integrated circuit of claim 1, wherein the isolation regions are of a second conductivity type.

3. The integrated circuit of claim 1 wherein the at least one power switching transistor is a vertical field effect transistor.

4. An integrated circuit having both logic devices and at least one power switching transistor formed on a substrate, wherein both the logic devices and the power switching transistor are powered by current received from an external power supply which is coupled to the substrate, the power transistor being powered by current flowing from the power supply to the substrate, and the logic devices being powered by current flowing from the power supply through the substrate and through a conductive layer which makes an ohmic contact to the substrate.

5. The integrated circuit of claim 4 further including at least one area of a same conductivity type as the substrate, formed under the ohmic contact to the substrate for lowering resistance to current flow in the ohmic contact to the substrate.

6. The integrated circuit of claim 4 further comprising a heatsink that is in electrical contact with the substrate; and a conductive lead which is coupled to the heatsink and extends away from the heatsink, wherein the external power supply is coupled to the heatsink and the conductive lead.

7. The integrated circuit of claim 4 wherein the at least one power switching transistor is a field effect transistor.

8. The integrated circuit of claim 6 wherein the at least one power switching transistor is a vertical field effect transistor.

9. The integrated circuit of claim 4 wherein the logic devices are field effect transistors.

10. An integrated circuit having both logic devices and at least one power switching transistor comprising: a package with a conductive die mount portion and a conductive lead portion electrically coupled to each other, wherein the package lead portion extends outside the package and is electrically coupled to a power supply; a semiconductor substrate of a first conductivity type and having a first and a second surface; a conductive layer attaching the second surface of the substrate to the package die mount portion; a buried isolation region of a second conductivity type selectively formed on the first surface of the substrate; an epitaxial layer of the first conductivity type, covering the first surface including the buried isolation region; isolation regions of the second conductivity type extending through the epitaxial layer to the buried isolation region, the logic devices being located within an area bounded by both the buried isolation region and the isolation regions which extend through the epitaxial layer, and the at least one power switching transistor being located in an area not bounded by the buried isolation region; a selectively patterned metal layer on the first surface of the epitaxial layer making ohmic contact to at least one of the logic devices and making ohmic contact to at least one area of the semiconductor substrate not bounded by the buried isolation region; whereby current flows from the power supply, through the package die mount portion and lead portion to the semiconductor substrate, and through the semiconductor substrate and the metal layer to the logic devices.

11. An integrated circuit having both logic devices and at least one power switching transistor comprising: a package with a conductive die mount portion and a conductive lead portion electrically coupled to each other, wherein the package lead portion extends outside the package and is electrically coupled to a power supply; a semiconductor substrate of a first conductivity type and having a first and second surface; a conductive layer attaching the second surface of the substrate to the package die mount portion; a buried isolation region of a second conductivity type selectively formed on the first surface of the substrate; an epitaxial layer of the first conductivity type, covering the first surface including the buried isolation region; isolation regions of the second conductivity type extending through the epitaxial layer to the buried isolation region, the logic devices being located within an area bounded by the buried isolation region, and at least one power switching transistor being located in an area not bounded by the buried isolation region; a selectively patterned metal layer on the first surface of the epitaxial layer making ohmic contact to at least one of the logic devices and making ohmic contact to at least one area of the semiconductor substrate not bounded by the buried isolation regions; whereby current flows from the power supply, through the package die mount portion and lead portion to the semiconductor substrate, and through the semiconductor substrate and the metal layer to the logic devices, wherein the at least one power switching transistor is a vertical field effect transistor having a drain electrode on the second surface of the substrate.

* * * * *